(12) United States Patent
Kozuki et al.

(10) Patent No.: US 10,076,031 B2
(45) Date of Patent: Sep. 11, 2018

(54) ELECTRONIC DEVICE AND METHOD OF MANUFACTURING ELECTRONIC DEVICE

(71) Applicant: SEIKO INSTRUMENTS INC., Chiba-shi, Chiba (JP)

(72) Inventors: Atsushi Kozuki, Chiba (JP); Hideshi Hamada, Chiba (JP); Yoshifumi Yoshida, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 339 days.

(21) Appl. No.: 14/519,331

(22) Filed: Oct. 21, 2014

(65) Prior Publication Data

US 2015/0116969 A1   Apr. 30, 2015

(30) Foreign Application Priority Data

Oct. 25, 2013   (JP) .................. 2013-222589

(51) Int. Cl.
| | |
|---|---|
| *H05K 1/11* | (2006.01) |
| *H05K 3/46* | (2006.01) |
| *H05K 3/00* | (2006.01) |
| *H05K 1/18* | (2006.01) |
| *H05K 1/09* | (2006.01) |
| *H05K 3/40* | (2006.01) |
| *B81B 7/00* | (2006.01) |

(Continued)

(52) U.S. Cl.
CPC .............. *H05K 1/09* (2013.01); *B81B 7/007* (2013.01); *H05K 3/4007* (2013.01); *H05K 3/4046* (2013.01); *H01L 23/055* (2013.01); *H01L 2224/16225* (2013.01); *H01L 2224/16227* (2013.01); *H01L 2924/00014* (2013.01); *H01L 2924/16152* (2013.01); *H05K 1/0306* (2013.01); *H05K 1/181* (2013.01); *H05K 3/108* (2013.01); *H05K 2201/0338* (2013.01); *H05K 2201/0347* (2013.01); *H05K 2201/10287* (2013.01)

(58) Field of Classification Search
CPC ... H05K 1/11; H05K 3/46; H05K 3/00; H05K 1/18; H05K 1/09; H05K 1/092; H05K 3/0091
USPC ........................................................ 361/772
See application file for complete search history.

(56) References Cited

U.S. PATENT DOCUMENTS

| | | | |
|---|---|---|---|
| 2005/0133910 A1* | 6/2005 | Riedl ........................ | C23C 8/80 257/729 |
| 2006/0131731 A1* | 6/2006 | Sato ........................ | B81B 7/007 257/704 |

(Continued)

*Primary Examiner* — Michael P McFadden
(74) *Attorney, Agent, or Firm* — Bruce L. Adams; Klintworth & Rozenblat IP LLP

(57) ABSTRACT

An electronic device includes an insulating base substrate having a through electrode, an electronic element provided on one surface of the insulating base substrate and connected to the through electrode, a lid provided on the one surface of the insulating base substrate, and an external electrode covering an end face of the through electrode that is exposed on another surface of the insulating base substrate different from the one surface thereof. The external electrode has a conductive film, a first electrolytic plating film provided on the conductive film, and a second electrolytic plating film provided on the first electrolytic plating film. The conductive film is provided on the exposed end face of the through electrode and on portions of the another surface of the insulating base substrate in the vicinity of the exposed end face of the through electrode.

19 Claims, 6 Drawing Sheets

(51) Int. Cl.
  *H05K 1/03*    (2006.01)
  *H05K 3/10*    (2006.01)
  *H01L 23/055*  (2006.01)

(56) References Cited

U.S. PATENT DOCUMENTS

| | | | |
|---|---|---|---|
| 2010/0314254 A1* | 12/2010 | Kodani | C25D 5/022 205/78 |
| 2011/0236658 A1* | 9/2011 | Motoki | H01G 4/232 428/213 |
| 2012/0153779 A1* | 6/2012 | Sato | H03H 9/02133 310/344 |

* cited by examiner

【Fig.1】
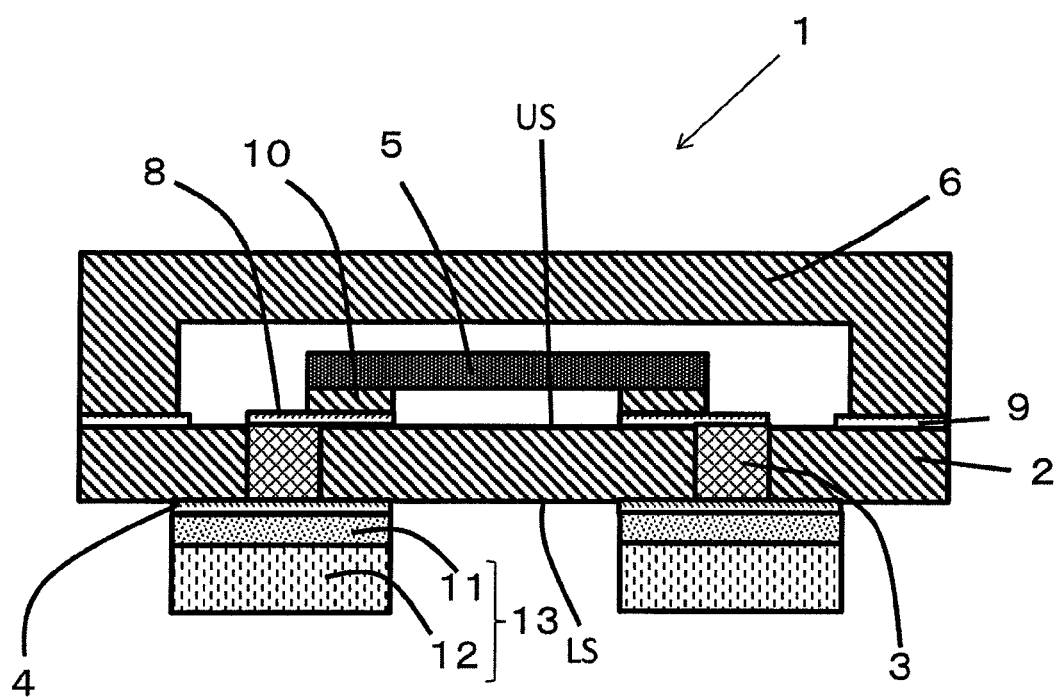

[Fig. 2]
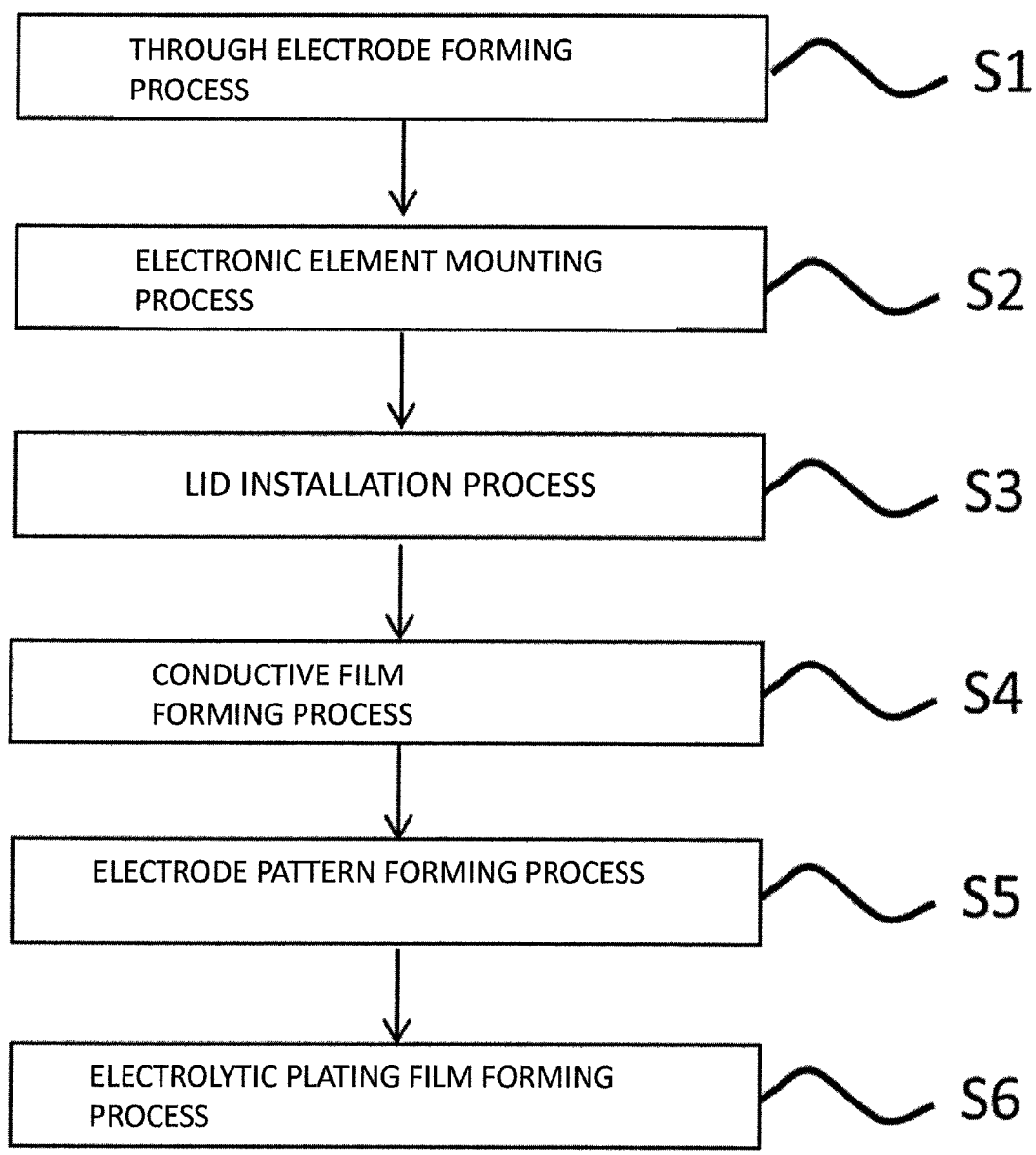

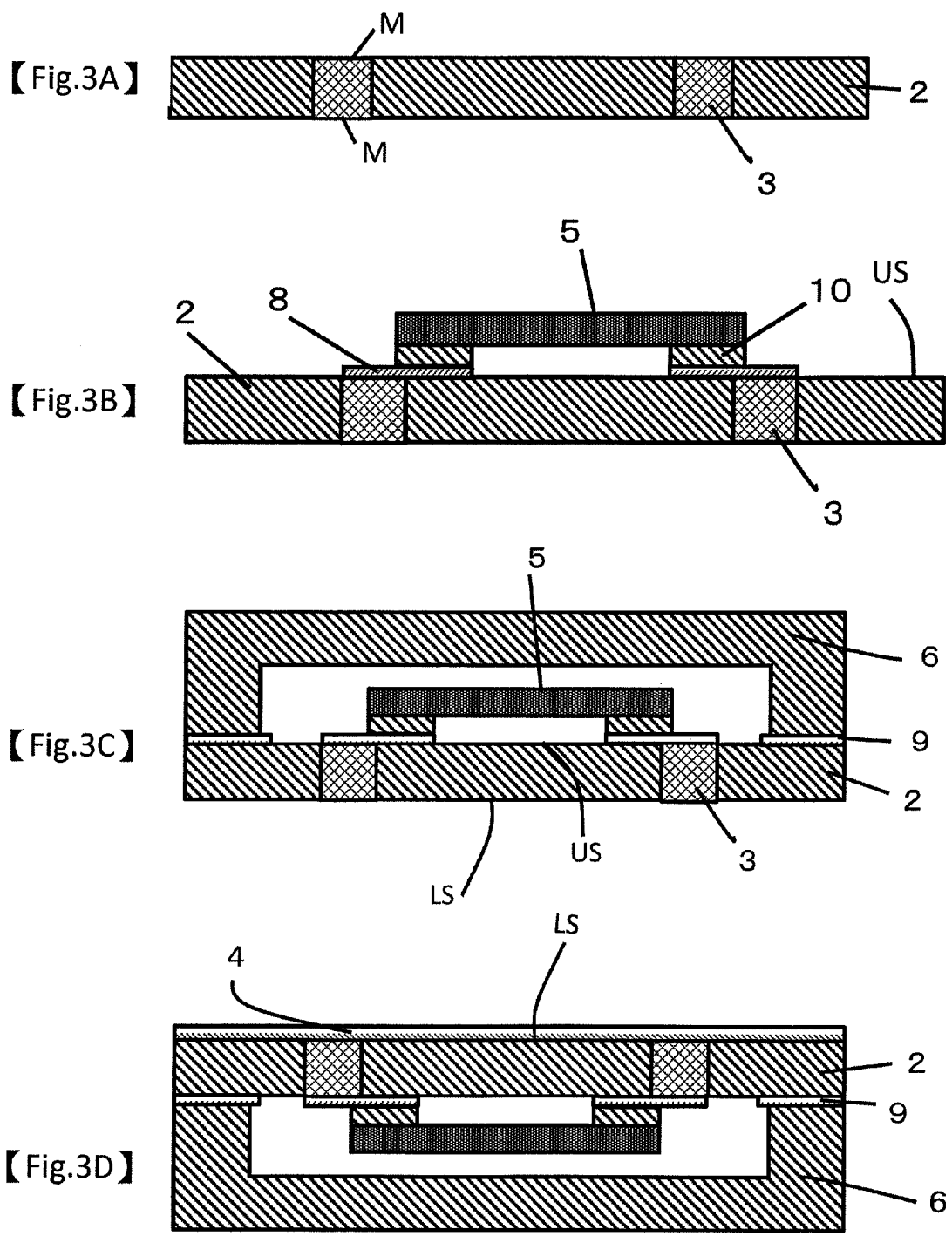

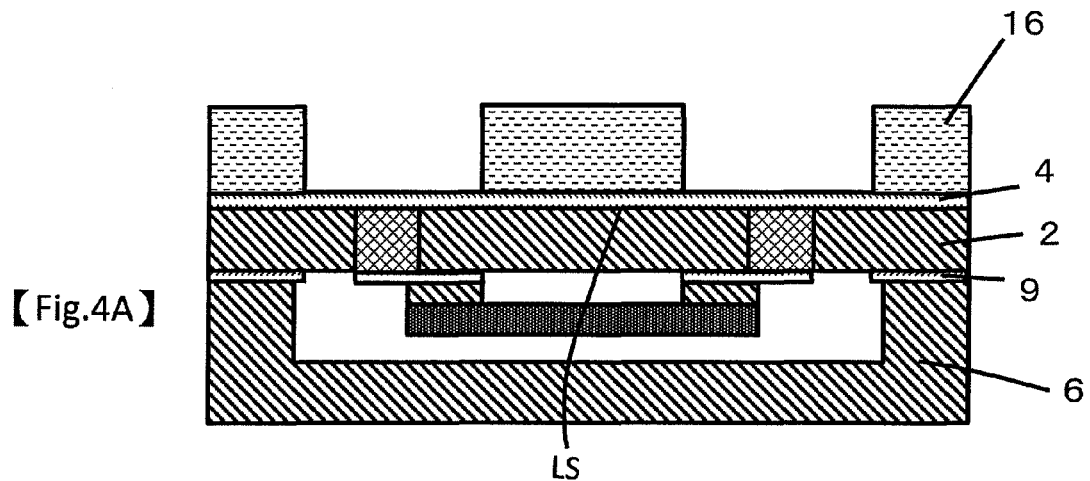
[Fig.4A]
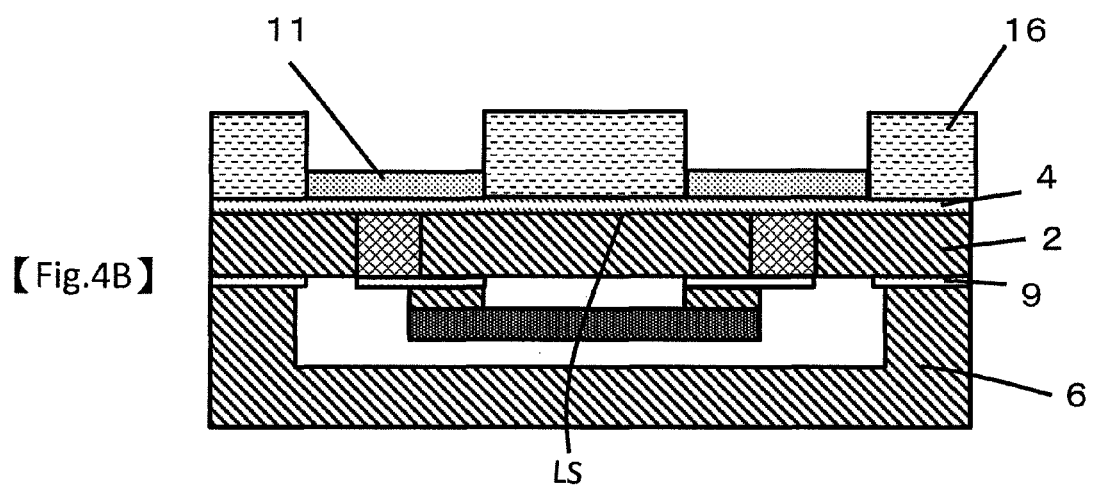
[Fig.4B]
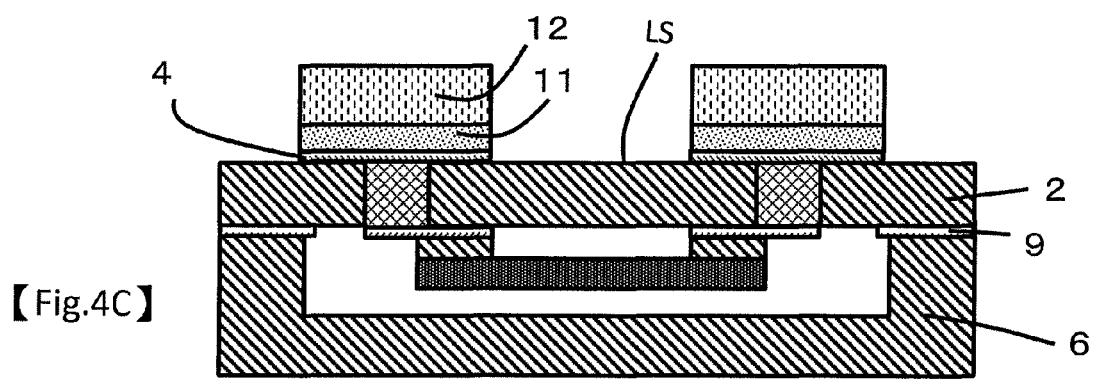
[Fig.4C]

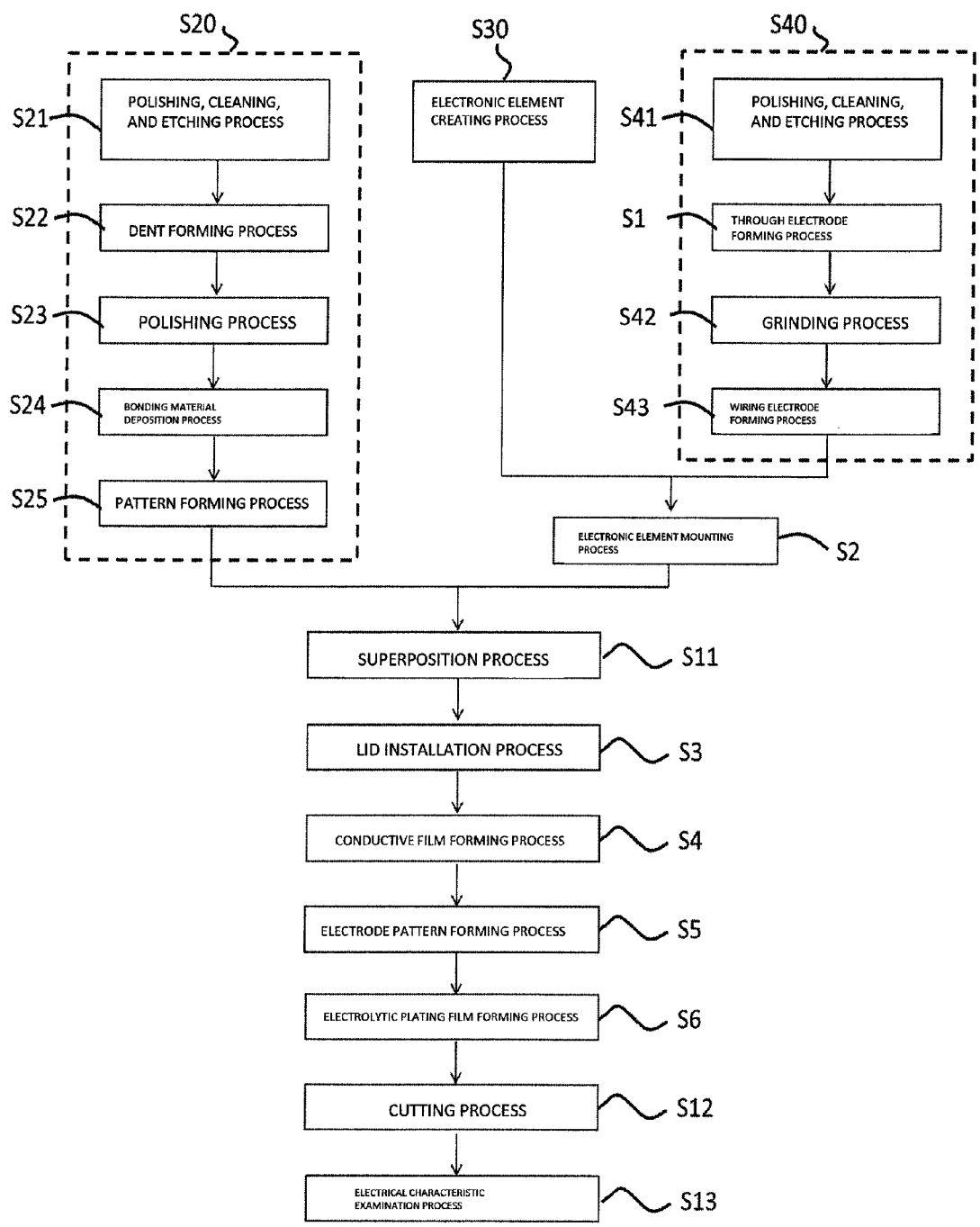
[Fig.5]

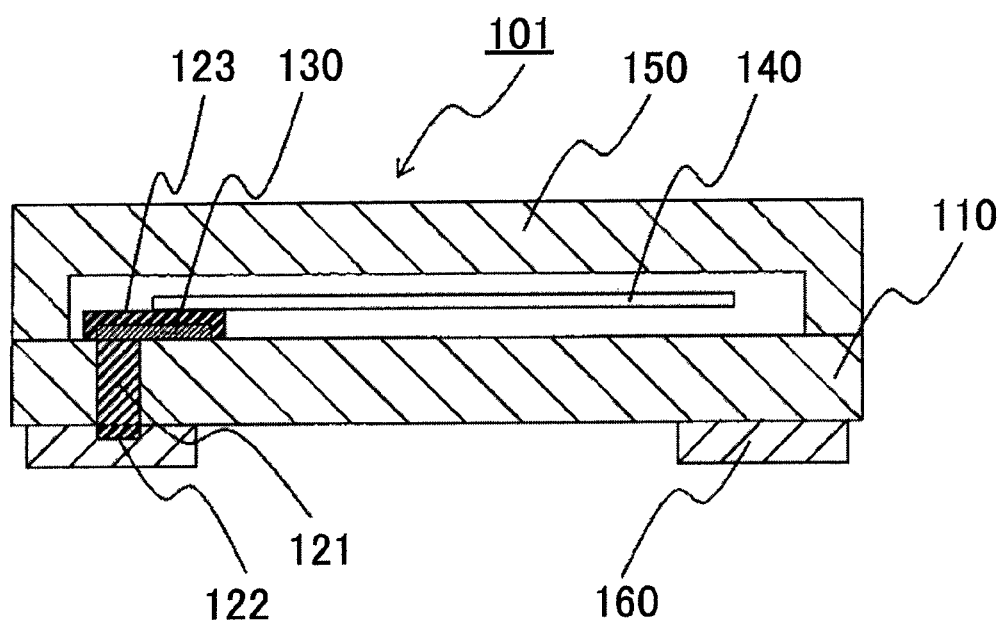
[Fig.6]

ELECTRONIC DEVICE AND METHOD OF MANUFACTURING ELECTRONIC DEVICE

BACKGROUND OF THE INVENTION

Field of the Invention

The present invention relates to an electronic device that accommodates an electronic element in a package, and a method of manufacturing an electronic device.

Background Art

Hitherto, surface-mounted electronic devices have generally been used for mobile phone and mobile information terminals. Meanwhile, in crystal vibrators, micro electro mechanical systems (MEMS), gyroscopes, acceleration sensors, and the like, a hollow cavity is formed inside a package, and an electronic element such as a crystal vibrator and a MEMS is enclosed in the cavity. A glass material is used as the package. For example, the electronic element is mounted on a base substrate, and a glass lid is bonded thereto by anodic bonding, thereby sealing the electronic element. Anodic bonding between glass materials has the advantages of high air tightness and low costs (JP-A-2011-155506).

FIG. 6 is a cross-sectional view of this type of electronic device (FIG. 1 of JP-A-2011-155506). An electronic device 101 includes a base 110, an electronic component 140 mounted on the base 110, and a cap 150 which accommodates the electronic component 140 and is bonded to the base 110. The base 110 is provided with a through electrode 121 passing through the base in a through-thickness direction, a first metal film 122 which is electrically connected to the through electrode 121, and a circuit pattern 130 and a second metal film 123 which electrically connect the through electrode 121 and the electronic component 140 to each other. An external electrode 160 formed of a metal film is formed outside the first metal film 122.

Here, a nickel-iron alloy is used as the through electrode 121. Gold formed by an electroless plating method is used as the first metal film 122. In addition, a low melting point glass, not shown in the drawing, is used between the through electrode 121 and base 110 to improve air tightness by thermal welding.

In this type of electronic device, a nickel-iron alloy is used as the through electrode 121, and a gold thin film is used as the first metal film 122 for preventing the through electrode 121 from oxidizing. Further, the external electrode 160 is mostly formed of a conductive adhesive such as a conductive paste. When the external electrode 160 is formed of a conductive adhesive such as a silver paste, it is difficult to completely block moisture due to an insufficient humidity resistance of the conductive paste. There is a great difference in ionization tendency between a nickel-iron alloy and gold. Accordingly, when moisture and the like are attached between the through electrode 121 and the first metal film 122, the through electrode 121 corrodes due to a battery effect, which causes a decrease in conductivity. In addition, a low melting point glass is used between the through electrode 121 and the base 110, and a gold thin film of the first metal film 122 is formed on an end face of the through electrode 121 by an electroless plating method. Since a gold thin film is not likely to be formed in the low melting point glass by an electroless plating method, a boundary portion between the through electrode 121 and the first metal film 122 is exposed, and thus there is a tendency for corrosion to progress.

SUMMARY OF THE INVENTION

According to an aspect of the present invention, there is provided a method of manufacturing an electronic device, the method including a through electrode forming process of forming a through electrode in an insulating base substrate; an electronic element mounting process of mounting an electronic element, which is electrically connected to the through electrode, on one surface of the base substrate; a lid installation process of bonding a lid accommodating the electronic element to the one surface of the base substrate; a conductive film forming process of covering an end face of the through electrode and the other surface of the base substrate which is located in a vicinity of the end face; a first electrolytic plating film forming process of forming a first electrolytic plating film on a surface of the conductive film by an electrolytic plating method; and a second electrolytic plating film forming process of forming a second electrolytic plating film, formed of tin or a tin alloy, on a surface of the first electrolytic plating film by an electrolytic plating method.

In the aspect, the first electrolytic plating film may be formed of a nickel film or a copper film in the first electrolytic plating film forming process.

In the aspect, the through electrode may be formed of a nickel-iron alloy in the through electrode forming process.

In the aspect, the first electrolytic plating film may be formed so as to expose a side surface of the conductive film in the first electrolytic plating film forming process.

In the aspect, the first electrolytic plating film may be formed to have a thickness of 1 µm to 3 µm in the first electrolytic plating film forming process.

In the aspect, the second electrolytic plating film may be formed to have a thickness of 10 µm to 30 µm in the second electrolytic plating film forming process.

In the aspect, the method may further include, before the conductive film forming process, a grinding process of grinding or polishing the other surface of the base substrate so that the end face of the through electrode and the other surface of the base substrate are formed to be flush with each other and of removing an oxide film formed on the end face.

According to another aspect of the present invention, there is provided an electronic device including an insulating base substrate in which a plurality of through electrodes are formed; an electronic element which is electrically connected to the through electrodes and is mounted on one surface of the base substrate; a lid which accommodates the electronic element and is bonded to the one surface of the base substrate; and an external electrode which covers a region ranging from an end face of the through electrode, which is exposed by the other surface of the base substrate, to the other surface in a vicinity of the end face. The external electrode includes a conductive film which covers a region ranging from the end face to the other surface in the vicinity of the end face, a first electrolytic plating film which is formed on a surface of the conductive film by an electrolytic plating method, and a second electrolytic plating film which is formed on a surface of the first electrolytic plating film by an electrolytic plating method. The second electrolytic plating film is formed of tin or a tin alloy.

In the aspect, the first electrolytic plating film may be formed of a nickel film or a copper film.

In the aspect, the through electrode may be formed of a nickel-iron alloy.

In the aspect, a side surface of the conductive film may be exposed.

In the aspect, the first electrolytic plating film may have a thickness of 1 µm to 3 µm.

In the aspect, the second electrolytic plating film may have a thickness of 10 µm to 30 µm.

According to the present invention, it is possible to block the permeation of moisture between a through electrode and an insulating base substrate to thereby prevent the occurrence of corrosion. In addition, since gold is not used for an external electrode, it is possible to prevent the occurrence of corrosion due to a battery effect.

In addition, since a second electrolytic plating film is formed of tin or a tin alloy having flexibility, it is possible to prevent the through electrode from corroding and to reduce stress occurring in the base substrate. In addition, at the time of mounting on an external component, it is possible to easily perform soldering.

BRIEF DESCRIPTION OF THE DRAWINGS

FIG. 1 is a schematic cross-sectional view of an electronic device according to the present invention.

FIG. 2 is a process diagram illustrating a method of manufacturing an electronic device according to the present invention.

FIGS. 3A to 3D are diagrams illustrating a process of manufacturing an electronic device according to the present invention.

FIGS. 4A to 4C are diagrams illustrating a process of manufacturing an electronic device according to the present invention.

FIG. 5 is a process diagram illustrating a method of manufacturing an electronic device according to the present invention.

FIG. 6 is a cross-sectional view of an electronic device which is well known in the related art.

DETAILED DESCRIPTION OF THE INVENTION

FIG. 1 is a schematic cross-sectional view of an electronic device 1 according to the present invention. The electronic device 1 includes a base substrate 2, a lid 6 which is bonded thereto, and an electronic element 5 which is accommodated therein. The base substrate 2 has an insulation property and includes a plurality of through electrodes 3 which pass through the base substrate from one surface US to the other surface LS. A wiring electrode 8 is formed on one surface US of the base substrate 2 so as to cover end faces of the through electrodes 3, and an electronic element 5 is mounted on the wiring electrode 8 through a metal bump 10. The lid 6 has a dent in the center thereof, accommodates the electronic element 5 in the dent thereof, and is bonded to one surface US of the base substrate 2 through a bonding material 9. The electronic device 1 further includes external electrodes 13 each of which covers a region ranging from the end face of the through electrode 3 which is exposed by the other surface LS of the base substrate 2 to the other surface LS in the vicinity of the end face. The external electrode 13 has a laminated structure which is constituted by a conductive film 4 which covers a region ranging from the end face to the other surface in the vicinity of the end face, a first electrolytic plating film 11 which is formed on the surface of the conductive film 4 by an electrolytic plating method, and a second electrolytic plating film 12 which is formed on the surface of the first electrolytic plating film 11 by an electrolytic plating method.

In this manner, the end face, which is exposed by the other surface LS of the through electrode 3 formed in the base substrate 2, and the other surface LS near the vicinity are completely covered with the conductive film 4. Further, the surface including the top surface and the side surface of the conductive film 4 is covered with the first electrolytic plating film 11 and the second electrolytic plating film 12. For this reason, the through electrode 3 does not come into contact with moisture and the like, and thus corrosion is prevented.

Glass, ceramics, plastic, a glass epoxy resin, or the like can be used as the base substrate 2. A piezoelectric vibration piece, a MEMS, an acceleration sensor, a light-emitting element, a light-receiving element, and other semiconductor elements can be used as the electronic element 5.

A nickel-iron alloy such as Kovar, Invar, Permalloy, 42 alloy, or stainless steel and other metal materials can be used as the through electrode 3.

A nickel film, a copper film, or other metal films can be used as the first electrolytic plating film 11. The first electrolytic plating film 11 is used as a base plating of the second electrolytic plating film 12. In addition, it is preferable that the first electrolytic plating film 11 be formed to have a thickness of 1 μm to 3 μm. When the thickness of the first electrolytic plating film 11 is equal to or greater than 1 μm, it is possible to reliably use the first electrolytic plating film as a base. In addition, when the thickness of the first electrolytic plating film 11 is equal to or less than 3 μm, it is possible to reliably suppress cracking occurring due to stress applied to the base substrate 2.

A metal film formed of tin or a tin alloy is used as the second electrolytic plating film 12. Based on this configuration, it is possible to prevent the through electrode 3 from corroding. Further, since the second electrolytic plating film 12 is formed of tin or a tin alloy having flexibility, it is possible to reduce stress occurring in the base substrate, as compared with a case of formation using only the first electrolytic plating film 11. In addition, at the time of mounting on the external component, it is possible to easily perform soldering. In addition, it is preferable that the second electrolytic plating film 12 be formed to have a thickness of 10 μm to 30 μm. When the thickness of the second electrolytic plating film 12 is equal to or greater than 10 μm, it is possible to reliably prevent the through electrode 3 from being exposed. In addition, when the thickness of the second electrolytic plating film 12 is equal to or less than 30 μm, it is possible to reliably obtain an effect of reducing stress occurring in the base substrate 2.

The conductive film 4 is used as a base film of an electrolytic plating film. In addition, it is possible to use a metal film such as a titanium film, a nickel film, or a copper film as the conductive film 4. When a metal film is used as the conductive film 4, a material having good adhesiveness with respect to the end face of the through electrode 3 and the base substrate 2 is adopted. In addition, it is preferable that a material having a small difference in ionization tendency be adopted with respect to the metal film to be formed on the conductive film 4. In addition, it is preferable that the conductive film 4 be deposited to have a thickness of 0.05 μm to 0.5 μm. When the thickness of the conductive film 4 is equal to or greater than 0.05 μm, it is possible to prevent the conductive film 4 from being melt and peeled during electrolytic plating. In addition, when the thickness of the conductive film 4 is equal to or greater than 0.5 μm, there is the possibility of the conductive film being not likely to be formed depending on the formation method thereof.

Meanwhile, the conductive film 4 may further include a first conductive film which is constituted by a metal film formed on the end face of the through electrode 3 by electroless plating, electrolytic plating, or the like or a metal film formed on the end face of the through electrode 3 and formed in the vicinity of the end face by vapor deposition or sputtering, and a second conductive film which is constituted by a titanium film, a nickel film, or a copper film formed on a first layer. The first conductive film is formed of gold, nickel, copper, titanium, chromium, or the like.

FIG. 2 is a process diagram illustrating a method of manufacturing an electronic device according to the present invention. FIGS. 3A and 3B and FIGS. 4A to 4C are diagrams illustrating processes in a method of manufacturing an electronic device according to the present invention. The same components or components having the same functions will be denoted by the same reference numerals.

As shown in FIG. 2, the method of manufacturing an electronic device of the present invention includes a through electrode forming process S1, an electronic element mounting process S2, a lid installation process S3, a conductive film forming process S4, an electrode pattern forming process S5, and an electrolytic plating film forming process S6. In the through electrode forming process S1, a through electrode is formed in an insulating base substrate in a through-thickness direction. In the electronic element mounting process S2, an electronic element is mounted on one surface of the base substrate. In the lid installation process S3, a lid accommodating the electronic element is bonded to the base substrate. In the conductive film forming process S4, a conductive film is formed on the other surface of the base substrate and an end face of the through electrode which is exposed by the other surface. In the electrode pattern forming process S5, the conductive film other than in a portion where an electrode pattern is formed by the end face of the through electrode and the conductive film formed in the vicinity of the end face is masked by a resist or the like. In the electrolytic plating film forming process S6, the first electrolytic plating film 11 and the second electrolytic plating film 12 are deposited on the surface of the conductive film in the electrode pattern by an electrolytic plating method to form an external electrode. That is, a process of forming the external electrode of this embodiment includes the conductive film forming process S4, the electrode pattern forming process S5, and the electrolytic plating film forming process S6. In addition, after the external electrode is formed, the masked resist and the conductive film other than the electrode pattern are removed by a wet etching method using an acid or an alkaline solution or by a dry etching method using a reactive gas.

Meanwhile, the manufacturing method of the present invention may include forming the conductive film on the other surface of the base substrate by the conductive film forming process S4, performing the electrode pattern forming process S5, performing the electrolytic plating film forming process S6, and mounting the electronic element on one surface of the base substrate in the electronic element mounting process S2, and lastly performing the lid installation process S3, after the through electrode forming process S1 and before the electronic element mounting process S2. In addition, the method can further include a grinding process of grinding or polishing the other surface of the base substrate 2 so that the end face of the through electrode and the other surface of the base substrate are flush with each other and so that an oxide film formed in the end face is removed, after the lid installation process S3 and before the conductive film forming process S4.

Thus, it is possible to prevent conductivity between the conductive film and the through electrode from being decreased, which will be described below in detail.

FIG. 3A is a schematic cross-sectional view showing a state where the through electrodes 3 are formed in the insulating base substrate 2 in the through electrode forming process S1. An insulating substrate, such as, for example, a glass substrate, a plastic substrate, or a glass epoxy resin substrate can be used as the base substrate 2. A nickel-iron alloy such as Kovar, Invar, Permalloy, 42 alloy, or stainless steel and other metal materials can be used as the through electrode 3. The use of a glass substrate as the base substrate 2 and the use of Kovar as the through electrode 3 can allow a package with high reliability to be formed due to their approximate thermal expansion coefficients. Hereinafter, a description will be given of an example in which a glass substrate is used as the base substrate 2 and a nickel-iron alloy is used as the through electrode 3.

The base substrate 2 formed of glass is softened and melted, and a through hole is formed by die forming. A wire rod of a nickel-iron alloy is filled in the through hole, and heating and softening are performed to weld the wire rod and the glass together. After the glass is cooled, both faces thereof are polished to be flattened. Then, an oxide film is removed by exposing an end face M of the through electrode 3, and the end face M and the surface of the base substrate 2 are formed to be flush with each other. The thickness of the flattened base substrate 2 is, for example, 0.2 mm to 1 mm. Meanwhile, the through hole of the base substrate 2 can also be formed by a sandblasting method or an etching method.

FIG. 3B is a schematic cross-sectional view showing a state where the electronic element 5 is mounted on the base substrate 2 in the electronic element mounting process S2. A metal film is formed on the one surface US by a vapor deposition method, a sputtering method, or the like, and the metal film is patterned by photolithography and an etching method, thereby forming the wiring electrode 8. The wiring electrode 8 may be formed by a printing method, in addition to a vapor deposition method and a sputtering method. Next, the electronic element 5 is installed on the base substrate 2 through the metal bump 10 by surface mounting. Instead of the surface mounting, the electronic element 5 may be attached to the surface of the base substrate 2 using an adhesive or the like, and the wiring electrode 8 and the electronic element 5 may be electrically connected to each other by wire bonding.

FIG. 3C is a schematic cross-sectional view showing a state where a lid 6 is bonded to one surface US of the base substrate 2 in the lid installation process S3. The same material as that of the base substrate 2, for example, a glass material can be used as the lid 6. The lid 6 has a dent in the center thereof, and the bonding material 9 is formed in advance on the upper end face of the dent. A conductive film such as an aluminum film, a chromium film, or a silicon film or a composite layer thereof is formed as the bonding material 9 by, for example, a vapor deposition method or a sputtering method. Then, the electronic element 5 is accommodated in the central dent, and the base substrate 2 and the lid 6 are bonded to each other by anodic bonding. The setting of the vicinity to be in a vacuum state at the time of the bonding can allow the inside of the package accommodating the electronic element 5 to be vacuumized. For example, when a crystal vibration piece is used as the electronic element 5, the maintaining of the inside of the package in a vacuum state can allow air resistance against the physical vibration of the crystal vibration piece to be eliminated. Meanwhile, the base substrate 2 and the lid 6 can be bonded to each other using intermetallic bonding or an adhesive depending on the intended use, in addition to using anodic bonding.

FIG. 3D is a schematic cross-sectional view showing a state where the conductive film 4 is formed on the other surface LS of the base substrate 2 in the conductive film forming process S4. The oxide film of the end face M is removed by polishing or cleaning the other surface LS of the base substrate 2. Next, the conductive film 4 formed of a metal is deposited on the other surface LS by a vapor deposition method or a sputtering method. In this embodiment, the conductive film 4 is deposited to have a thickness of 0.05 µm to 0.5 µm. The conductive film 4 is deposited on the entirety of the other surface LS across the end faces M of the plurality of through electrodes 3. In addition to a titanium film, a metal film such as a nickel film or a copper film can be used as the conductive film 4. When the metal film is used as the conductive film 4, a material having good adhesiveness with respect to the end face M and the base substrate 2 is adopted. In addition, it is preferable that a material having a small difference in ionization tendency be adopted with respect to the metal film to be formed on the conductive film 4.

Meanwhile, the metal film may be formed by performing electroless plating on the end face of the through electrode and by performing vapor deposition, sputtering, electrolytic plating, or the like on the vicinity of the end face, before forming the conductive film 4. A main metal to be processed includes gold, nickel, copper, titanium, chromium, and the like.

In addition, the conductive film is formed on the entirety of the other surface LS, and thus it is possible to collectively perform electrolytic plating on the plurality of electronic devices.

FIG. 4A is a schematic cross-sectional view showing a state where the conductive film other than in a portion where an electrode pattern is formed by the end face of the through electrode and the conductive film formed in the vicinity of the end face is masked by a resist or the like in the electrode pattern forming process S5. A photosensitive resin film formed of a resist is applied or pasted to the surface of the conductive film 4 other than the electrode pattern-formed portion, and then exposure and developing are performed thereon, thereby forming a mask other than in a region of the conductive film 4 in which an electrolytic plating film is formed. Instead of forming the mask out of the photosensitive resin film, the mask may be formed by a printing method.

FIG. 4B is a schematic cross-sectional view showing a state where the first electrolytic plating film 11 is deposited on the surface of the conductive film 4 in the electrolytic plating film forming process S6. The first electrolytic plating film 11 is deposited on the surface of the conductive film 4 by an electrolytic plating method to form the external electrode 13. The first electrolytic plating film 11 is formed by immersing the other surface LS in an electrolytic plating solution and causing the conductive film 4 to cover an exposed surface which is exposed by the other surface LS side. The first electrolytic plating film 11 is formed to have a thickness of 1 µm to 3 µm. In addition, the first electrolytic plating film 11 can be formed of a copper film or other metal films in addition to a nickel film. Then, the second electrolytic plating film 12 is formed. The second electrolytic plating film 12 is formed to have a thickness of 10 µm to 30 µm. A metal film formed of tin or a tin alloy is formed as the second electrolytic plating film 12.

FIG. 4C shows a state where, after an electrolytic plating film is formed, the resist is removed and the metal film other than the external electrode pattern is removed by a wet etching method using an acid or an alkaline solution or by a dry etching method using a reactive gas in the electrolytic plating film forming process S6. Thus, the external electrode is formed.

In the manufacturing method of this embodiment, the side surface of the conductive film 4 is exposed. In addition, the side surfaces of the first electrolytic plating film 11 and the second electrolytic plating film 12 are also exposed.

FIG. 5 is a process diagram illustrating a method of manufacturing an electronic device according to the present invention, which shows a specific example in which an electronic device having an electronic element MEMS mounted thereon is manufactured. Meanwhile, this embodiment illustrates a manufacturing method of bonding a glass wafer provided with a plurality of dents and a glass wafer having a plurality of electronic elements mounted thereon to each other in an overlapping manner and of simultaneously forming the plurality of electronic devices 1. The same processes will be denoted by the same reference numerals and signs.

The electronic element mounted on the base substrate is an element such as a MEMS. A lid forming process S20 will be described below. A plate-shaped glass wafer formed of soda-lime glass is prepared. First, in a polishing, cleaning, and etching process S21, the glass wafer is polished to have a predetermined thickness and is cleaned, and then an etching process is performed to remove a work-affected layer of the outermost surface. Next, in a dent forming process S22, a dent is formed in the central portion of a region where each electronic device is formed, by die forming of a heat press. Next, in a polishing process S23, an upper end face in the vicinity of the dent is polished into a flat mirror surface. Next, in a bonding material deposition process S24, a bonding material formed of, for example, aluminum is deposited on the surface in which the dent is formed, so as to have a thickness of 50 nm to 150 nm by a sputtering method or a vapor deposition method. Next, in a pattern forming process S25, the bonding material is removed from the surface other than the upper end face in the vicinity of the dent by photolithography and an etching method. In this manner, a lid formed of a glass wafer is formed.

An electronic element creating process S30 will be described below. The electronic element is processed into an outer shape by photolithography, an etching method, or dicing in a silicon substrate or the like.

A base substrate forming process S40 will be described below. A plate-shaped glass wafer formed of soda-lime glass is prepared. First, in a polishing, cleaning, and etching process S41, a glass wafer is polished to have a predetermined thickness and is cleaned, and then etching process is performed to remove a work-affected layer of the outermost surface. Next, in the through electrode forming process S1, a through hole is formed in a through-thickness direction of the glass wafer by die forming of a heat press or by installing a mask on the surface and then performing grinding thereon using an etching process or sandblasting. Next, a through electrode formed of a nickel-iron alloy is buried in the through hole. Next, in a grinding process S42, both ends of the through electrode and both faces of the glass wafer are polished to be flattened so that the end face of the through electrode is exposed, thereby forming a base substrate. Next, in a wiring electrode forming process S43, a metal film is deposited on one surface of the base substrate by a sputtering method or a vapor deposition method, and patterning is performed by photolithography and an etching method, thereby forming a wiring electrode.

Next, in the electronic element mounting process S2, the electronic element is mounted on one surface of the base substrate. At the time of the mounting, a conductive adhesive or a metal bump is installed in the wiring electrode of the base substrate, and an electrode of the base substrate is bonded thereto to fix the electronic element onto the base substrate. Thus, the through electrode and the electronic element are electrically connected to each other. In this manner, the base substrate formed of the glass wafer having the plurality of electronic elements mounted thereon is formed.

Next, in a superposition process S11, the lid is placed on the base substrate so that the electronic element is accommodated in each dent of the lid, and pressing is performed from the vertical direction. Next, in the lid installation process S3, the base substrate and the lid are heated to a temperature of 200° C. or higher, and a voltage of several hundreds of V is applied by setting the bonding material of the lid to an anode and setting the base substrate to a cathode, thereby bonding the base substrate and the lid to each other through the bonding material. At the time of the bonding, the vicinity is maintained in a vacuum state.

Next, in the conductive film forming process S4, a conductive film formed of nickel is deposited on the other surface of the base substrate by a vapor deposition method or a sputtering method. Next, in the electrode pattern forming process S5, a resist film or the like is pasted to the conductive film in which the electrode pattern is formed using a photosensitive resin film, and then exposure and developing are performed thereon, thereby forming a mask other in than a region of the conductive film 4 in which an electrolytic plating is formed. Meanwhile, the mask may be formed by a printing method. Thereafter, the mask is removed, and the electrode pattern using a conductive film is formed on the end face of the through electrode and the surface in the vicinity of the end face.

Next, in the electrolytic plating film forming process S6, the first electrolytic plating film 11 and the second electrolytic plating film 12 are deposited on the surface of the conductive film by an electrolytic plating method to form the external electrode.

After a plating film is formed, the resist is removed, and the metal film having a sputter-deposited film formed therein, other than the pattern, is removed by a wet etching method using an acid or an alkaline solution or by a dry etching method using a reactive gas.

Next, in a cutting process S12, a scribing line is provided on the surface of the assembly, and the assembly is cut by pressing a cutting blade or is divided using a dicing blade or a dicing saw, thereby obtaining the individual electronic devices 1. Next, in an electrical characteristic examination process S13, examination is performed by measuring a resonance frequency, a resonance resistance value, and the like of the electronic device 1.

Meanwhile, a method of manufacturing an electronic device is not limited to this embodiment, and various methods can be adopted.

What is claimed is:

1. An electronic device comprising:
    an insulating base substrate comprised of glass and through which extend a plurality of nickel-alloy through electrodes;
    an electronic element which is electrically connected to the through electrodes and is mounted on one surface of the base substrate;
    a lid which accommodates the electronic element and is bonded to the one surface of the base substrate; and
    a plurality of external electrodes each covering a region ranging from an end face of one through electrode, which is exposed by the other surface of the base substrate, to the other surface in a vicinity of the end face,
    wherein each external electrode includes a conductive film which covers a region ranging from the end face to the other surface in the vicinity of the end face, a first electrolytically plated film which is formed on a surface of the conductive film, and a second electrolytically plated film which is formed on a surface of the first electrolytically plated film, and
    wherein the second electrolytically plated film is formed of tin or a tin alloy.

2. The electronic device according to claim 1, wherein the first electrolytically plated film is formed of a nickel film or a copper film.

3. The electronic device according to claim 1, wherein each through electrode is formed of a nickel-iron alloy.

4. The electronic device according to claim 1, wherein a side surface of the conductive film is exposed.

5. The electronic device according to claim 1, wherein the first electrolytically plated film has a thickness of 1 μm to 3 μm.

6. The electronic device according to claim 1, wherein the second electrolytically plated film has a thickness of 10 μm to 30 μm.

7. An electronic device comprising:
    an insulating base substrate comprised of glass and through which extends a nickel-alloy through electrode;
    an electronic element provided on one surface of the insulating base substrate and connected to the through electrode;
    a lid provided on the one surface of the insulating base substrate; and
    an external electrode covering an end face of the through electrode that is exposed on another surface of the insulating base substrate different from the one surface thereof, the external electrode having a conductive film, a first electrolytically plated film provided on the conductive film, and a second electrolytically plated film provided on the first electrolytically plated film, the conductive film being provided on the exposed end face of the through electrode and on portions of the another surface of the insulating base substrate in the vicinity of the exposed end face of the through electrode.

8. The electronic device according to claim 7, wherein the second electrolytically plated film is formed of tin or a tin alloy.

9. The electronic device according to claim 7, wherein the second electrolytically plated film is electrolytically plated on the first electrolytically plated film.

10. The electronic device according to claim 7, wherein the first electrolytically plated film is formed of a nickel film or a copper film.

11. The electronic device according to claim 7, wherein the through electrode is formed of a nickel-iron alloy.

12. The electronic device according to claim 7, wherein a side surface of the conductive film is exposed.

13. The electronic device according to claim 7, wherein the first electrolytically plated film has a thickness of 1 μm to 3 μm.

14. The electronic device according to claim 7, wherein the second electrolytically plated film has a thickness of 10 μm to 30 μm.

15. An electronic device comprising:
- a glass base substrate having a first surface, a second surface opposite the first surface, and a plurality of nickel-alloy through electrodes extending through the glass base substrate in direct contact therewith from the first surface to the second surface, each of the through electrodes having an end face exposed from the second surface;
- an electronic element provided on the first surface of the glass base substrate and connected to the plurality of through electrodes;
- a lid provided on the first surface of the glass base substrate; and
- a plurality of external electrodes covering the exposed end faces of the respective plurality of through electrodes, each of the external electrodes having a conductive film, a first electrolytically plated film provided on the conductive film, and a second electrolytically plated film provided on the first electrolytically plated film, the conductive film being provided on the exposed end face of the through electrode and on portions of the second surface of the glass base substrate in the vicinity of the exposed end face of the through electrode.

16. The electronic device according to claim 15, wherein each of the plurality of through electrodes is formed of a nickel-iron alloy; and wherein for each of the plurality of external electrodes, the first electrolytically plated film is formed of a nickel film or a copper film and wherein the second electrolytically plated film is formed of tin or tin alloy.

17. The electronic device according to claim 15, wherein for each of the plurality of external electrodes, a side surface of the conductive film is exposed.

18. The electronic device according to claim 15, wherein for each of the plurality of external electrodes, the first electrolytically plated film has a thickness of 1 μm to 3 μm and the second electrolytically plated film has a thickness of 10 μm to 30 μm.

19. The electronic device according to claim 15; wherein the glass base substrate has a uniform composition.

* * * * *